United States Patent
Böberl et al.

(10) Patent No.: US 8,507,865 B2
(45) Date of Patent: Aug. 13, 2013

(54) ORGANIC PHOTODETECTOR FOR THE DETECTION OF INFRARED RADIATION, METHOD FOR THE PRODUCTION THEREOF, AND USE THEREOF

(75) Inventors: Michaela Böberl, Enns (AT); Jens Fürst, Herzogenaurach (DE); Wolfgang Heiss, Linz (AT); Maksym Kovalenko, Chicago, IL (US); Tobias Rauch, Fürstenfeldbruck (DE)

(73) Assignee: Siemens Aktiengesellschaft, Munich (DE)

( * ) Notice: Subject to any disclaimer, the term of this patent is extended or adjusted under 35 U.S.C. 154(b) by 272 days.

(21) Appl. No.: 12/733,679

(22) PCT Filed: Sep. 4, 2008

(86) PCT No.: PCT/EP2008/061653
§ 371 (c)(1),
(2), (4) Date: Jul. 26, 2010

(87) PCT Pub. No.: WO2009/037121
PCT Pub. Date: Mar. 26, 2009

(65) Prior Publication Data
US 2010/0294936 A1 Nov. 25, 2010

(30) Foreign Application Priority Data
Sep. 13, 2007 (DE) .......................... 10 2007 043 648

(51) Int. Cl.
*H01L 51/48* (2006.01)
(52) U.S. Cl.
USPC .................... 250/338.4; 250/370.01; 250/340

(58) Field of Classification Search
USPC ......................................................... 250/340
See application file for complete search history.

(56) References Cited

U.S. PATENT DOCUMENTS

| | | | |
|---|---|---|---|
| 8,211,996 B2 * | 7/2012 | Yang et al. | 528/380 |
| 2002/0017612 A1 * | 2/2002 | Yu et al. | 250/370.11 |
| 2004/0095658 A1 | 5/2004 | Buretea | |
| 2004/0159793 A1 * | 8/2004 | Brabec et al. | 250/370.11 |
| 2005/0236556 A1 * | 10/2005 | Sargent et al. | 250/214.1 |
| 2007/0207565 A1 * | 9/2007 | Kodas et al. | 438/61 |
| 2010/0127247 A1 * | 5/2010 | Yang et al. | 257/40 |

FOREIGN PATENT DOCUMENTS

| | | |
|---|---|---|
| WO | WO 9939395 A1 | 8/1999 |
| WO | WO 0122505 A1 | 3/2001 |
| WO | WO 2006016914 A2 | 2/2006 |
| WO | WO 2006134090 A1 | 12/2006 |
| WO | WO 2007017470 A1 | 2/2007 |

OTHER PUBLICATIONS

McDonald S. et al: "Solution-processed PbS quantum dot infrared photodetectors and photovoltaics" Nature materials Feb. 2005 naturepublishing Group GB; Seiten 138-142; Others.

(Continued)

*Primary Examiner* — David Porta
*Assistant Examiner* — Djura Malevic
(74) *Attorney, Agent, or Firm* — Staas & Halsey LLP

(57) ABSTRACT

An organic photodetector detects infrared radiation, particularly radiation within the spectral region of over 1100 nm, the so-called imager region. Contrary to the currently known photodetectors, such as the Bolometer, II-VI semiconductor, and quantum well detectors, the photodetector contains semiconducting nano-particles for shifting the range of detection, requires no technical and cost-intensive effort in the production thereof, and may be constructed of flexible substrates by simple printing methods.

14 Claims, 3 Drawing Sheets

(56) References Cited

OTHER PUBLICATIONS

Xiaomei Jiang et al: "PbSe nanocrystal/conducting polymer solar cells with an infrared response to2 micron" Journal of materials research, materials research society, Warrendale, PA, Bd. 22, Nr. 8, Aug. 1, 2007,Seiten 2204-2210; Others.

Shiga et al: "Photovoltaic performance and stability of CdTe/polymeric hybrid solar cells using a C60 buffer layer" Solar energy materials and solar cells, Elsevier science publishers, Amsterdam, NL, Bd. 90, Nr. 12, Jul. 24, 2006, Seiten 1849-1858; Others.

T. Rauch, M. Böberl, M. Kovalenko, S. Tedde, U. Lemmer, J. Fürst, W. Heiss, o. Hayden: "Near Infrared Sensitivity of PbS Quantum Dot sensitie Organic Photodiodes" DPG-Verhandlungen, Organic Polymer-Metal Interfaces (SYSA 7), Feb. 25, 2008-Feb. 29, 2008; Others.

* cited by examiner

ORGANIC PHOTODETECTOR FOR THE DETECTION OF INFRARED RADIATION, METHOD FOR THE PRODUCTION THEREOF, AND USE THEREOF

CROSS REFERENCE TO RELATED APPLICATIONS

This application is based on and hereby claims priority to PCT Application No. PCT/EP2008/061653 filed on Sep. 4, 2008 and DE Application No. 10 2007 043 648.5 filed on Sep. 13, 2007, the contents of which are hereby incorporated by reference.

BACKGROUND

The invention relates to an organic photodetector, which may be used for infrared radiation, particularly in the spectral region of over 1100 nm, the so-called imager region. The invention also relates to a method for the production of such a photodetector and for the use thereof.

WO2007/017470 discloses an organic photodetector in which an inorganically-based transistor matrix is used through a passivation layer as a substrate for the simple and cost-effective production of an organic photodetector.

Photodetectors that operate in the spectral region of over 1100 nm have hitherto only been known on an inorganic basis. There are so-called bolometers, which undergo a change in resistance when heated by IR-radiation. There are also photodiodes made from inorganic narrowband-gap semiconductors (II-VI, IV-VI). Finally, there are quantum well and quantum dot IR photodetectors, which are grown epitaxially from semiconductors with different band gaps and which likewise detect radiation in the longer-wavelength IR region.

The disadvantage of all these systems, however, is that they are produced using considerable quantities of costly and toxicologically questionable semiconductor materials, such as—for example—indium gallium arsenide, germanium and/or lead sulfide. Moreover, production of the known photodetectors is a technically complex and expensive process.

SUMMARY

One potential object, therefore, is to provide a photodetector for the imager region, which can be produced with a reduced quantity of toxicologically questionable materials compared to previously known photodetectors, using a simplified and more cost-effective method.

The inventors propose an organically-based photodetector, comprising a first electrode, a second electrode and an organically-based photoactive layer arranged between the two electrodes, wherein the photoactive layer contains semiconducting nanoparticles. The inventors also propose a method for the production of an organically-based photodetector, wherein at least the photoactive layer may be produced with nanoparticles from a solution. The inventors still further propose the use of an organically-based photodetector in IR tomography (IR imaging) and in safety engineering.

According to an advantageous embodiment, the nanoparticles it contains are present at least partially in the form of nanocrystals.

According to an advantageous embodiment, the semiconducting nanoparticles or nanocrystals are soluble in the organically-based photoactive layer, so that the advantages in the production of organic electronics, particularly the solution-based processing, can be retained despite the use of nanocrystals. In this way it is possible to ensure that the organically-based photoactive layer may furthermore be cost-effectively applied to the respective substrates by known deposition methods such as spin-coating, doctor blading, and/or printing processes. Both large-area as well as pixilated IR photodetectors can be produced in this way.

The solution-processable application techniques can open up a large range of substrates, including in flexible form, wherein semi-finished as well as finished modules are suitable for the application of organic photodiodes by efficient methods, including in stacked and/or multilayer form.

According to a particularly advantageous embodiment, at least part of the nanoparticles or nanocrystals are contained in the photoactive layer in colloidal state.

Through the selection and dimension of the nanoparticles it is possible to influence the wavelength region in which detection takes place.

Photodiodes from a vertical layer system are suitable, for example, as organically-based photodetectors, wherein—for example—a PEDOT layer having a P3HT-PCBM blend is located between the lower indium tin oxide electrode (ITO electrode) and an upper electrode which—for example—comprises calcium and silver. The blend of the two components P3HT (poly(hexylthiophene)-2-5-diyl) as absorbers and/or hole transport components and PCBM (PhenylC61 butyric acid methyl ester)—as electron acceptors and/or electron conductors works as a so-called bulk heterojunction, i.e. the separation of the charge carriers takes place at the interfaces of the two materials, that form within the entire layer volume. The solution may be modified by replacing or adding further materials. The solution is modified by adding the nanoparticles, resulting in a considerable extension of spectral sensitivity in the infrared spectral region.

This extension in the infrared spectral region is brought about by the quantum mechanical effect of the quantization of energy levels of the nanoparticles and/or by the quantum dots from the II-VI, IV-VI semiconductors. A large, three-dimensional semiconductor crystal has an energy gap. If photons with an energy greater than this energy gap meet the crystal, electrical charges are generated in the form of electron-hole pairs. If the size of the crystal is reduced in all 3 dimensions, the energy gap of the crystal is moved to higher energies. Thus, for example, the energy gap of PbS of approx. 0.42 eV (corresponding to a light wavelength of approx. 3 μm) in nanocrystals with a size of approx. 10 nm can be increased to 1 eV (corresponding to a light wavelength of 1240 nm). If the diameter of the nanoparticles is changed, then their absorption or emission behavior also changes.

As described above, by using a lead sulfide (PbS)-nanocrystal it is possible to obtain an absorption of around 1150 nm. A further modification of the absorption range is possible on the above basis simply by selecting the geometry or the material of the nanoparticles.

For example, by varying the crystal diameter the sensitive wavelength region can be adjusted from approx. 850 nm to 1800 nm. By changing the material system, for example from lead sulfide (PbS) to lead selenide (PbSe), wavelengths of up to 4 μm can be achieved.

Generally speaking, different nanoparticles or combinations of different nanoparticles may be used. The nanoparticles are of lead sulfide, cadmium telluride (CdTe), mercury telluride (HgTe) and/or lead selenide (PbSe), for example.

The nanoparticles are normally suspended in solutions with a concentration of 1-50 mg/ml. The proportion by weight of nanoparticles in the active layer is of the same order of magnitude as that of other substances. For example, the weight ratio in a detector with PbS:P3HT:PCBM active layer is e.g. 2:1:1.

Nanoparticles may be mixed with the organic active layers, for example, by adding them to hole transporters or electron conductors and by replacing the hole transporter or electron conductors with the nanoparticles. Furthermore, mixing them by adding them to the bulk heterojunction system may be achieved so that a bulk heterojunction (PbS:P3HT:PCBM) results.

The nanoparticles absorb in the IR region, resulting in excited load carriers which are extracted with the help of an applied voltage. In addition, the photoconductive effect may be exploited by an electrical voltage and thus the signal may be intensified without a preliminary stage.

Since organic solutions can be processed on virtually every substrate, optical specifications are essentially taken into account in the selection of substrates so that layered or unlayered films or substrates may be used, that are pervious only in the relevant spectral region, such as GaAs>870 nm; Si>1100 nm or substrates with filter coatings, for example.

The proposed organic IR photodetectors can be used as light barriers or curtain detectors in safety engineering because by using the photodetectors that are applicable over a large area, a large safety area may be achieved. The safety element in this application functions in the conventional way, for example so that when an employee arrives in the safety area of a machine, he breaks the light beam and thus triggers appropriate safety measures such as—for example—deactivation of the system.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
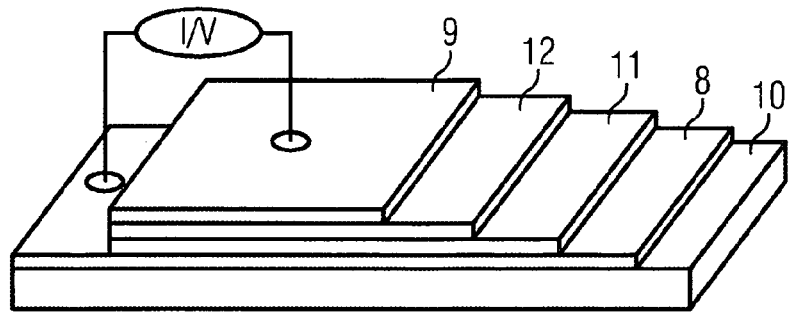
FIG. 1 shows the schematic structure of an organic photodetector.

Reference will now be made in detail to the preferred embodiments of the present invention, examples of which are illustrated in the accompanying drawings, wherein like reference numerals refer to like elements throughout.

FIG. 1 shows, for example, the structure of an organic photodiode. The diode is formed of one or more active organic layers, which are applied to a substrate 10 between two electrodes 8, 9. The substrate 10 typically is formed of glass, but may however also be constructed from a metal foil, plastic film or other substrate material. A film that is nonpervious for visible light, such as the one used in the Leopard II tank, for example, may be used as a possible flexible substrate.

In the example shown, the lower electrode 8 is implemented as the anode and the upper electrode 9 as the cathode, however the polarity of the electrodes may also be arranged in reverse.

FIG. 1 shows a layer structure with two active organic layers: a hole transporter 11 and the actual photoconductive layer 12. In addition to the layers shown here, it is still necessary for the module to be protected by encapsulation. The photoconductive organic layer 12 may be the so-called bulk heterojunction, for example implemented as a blend of a hole-transported polythiophene and an electron-transported fullerene derivative, displaced by the corresponding nanoparticles such as—for example—nanocrystals from lead sulfide and/or lead selenide. The nanoparticles are present in this organically-based photoactive layer, for example, by being dissolved or also, for example, by being dispersed colloidally.

The anode 8, for example, is formed from indium-tin oxide (ITO), gold, palladium, silver or platinum or platinum and is manufactured by a sputtering or vapor deposition process.

The resulting active organic layers are likewise separated over a large area, for example by spin coating, spray coating, doctor blading, dip coating, screen printing, flexographic printing, slit coating, ink-jet printing, etc. These processes permit a large area to be coated, mainly since no structuring of the semiconductor is required inside the active sensor area.

The cathode 9 may, for example, be formed from Ca, Al, Ag, ITO, LiF, Mg or various combinations of these materials, and is typically applied by thermal evaporation or electron beam evaporation.

By the various work functions of the two electrodes, an internal electrical field is formed which separates the electron hole pairs caused by the absorption of light quantums.

Figure 2:
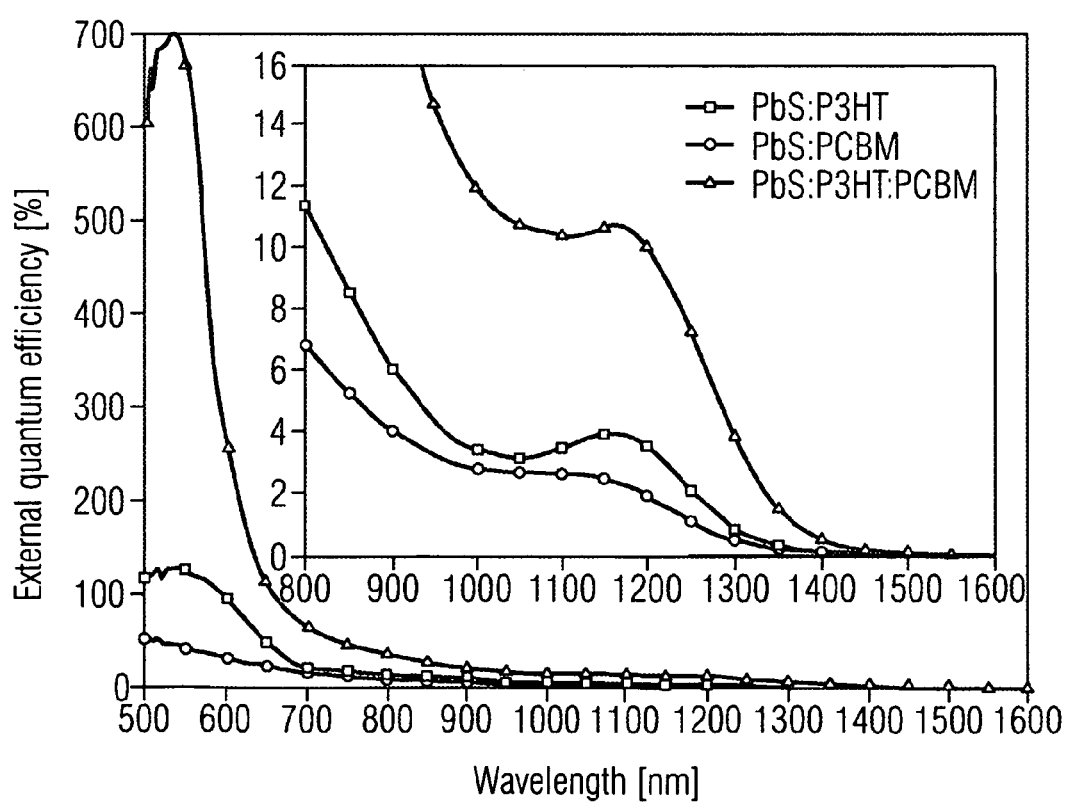
FIG. 2 shows the external quantum efficiencies of bulk heterojunction material systems replaced with lead sulfide.

FIG. 2 shows the sensitivity of the organic photodetectors on the basis of a diagram in which the external quantum efficiencies for the three material systems are a) PbS:P3HT, b) PbS:PCBM and c) PbS:P3HT:PCBM. The measurements show values at 5V reverse voltage. Without the PbS nanocrystals no external quantum efficiency would be measurable for wavelengths greater than approx. 670 nm, since the materials without PbS would be transparent in this long-wave region. Thus the external quantum efficiency without PbS nanocrystals in the spectral region used in FIG. 2 is 0. In the visible spectral region up to 670 nm, the values without the PbS nanocrystals would be less than 100%, since there is no photoconductive effect.

Figure 3A:
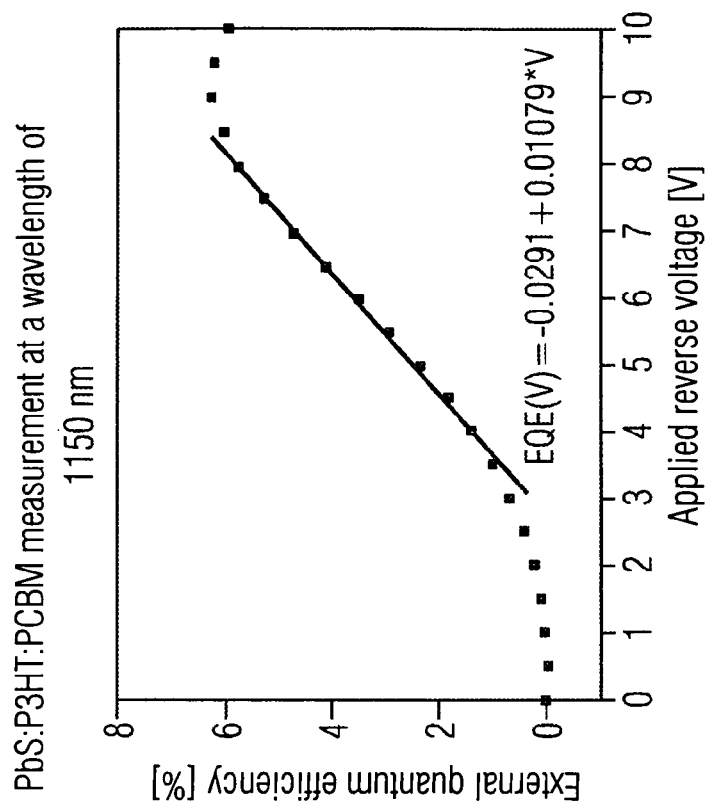
FIGS. 3a and 3b show the external quantum efficiency depending on the reverse voltage applied, and FIGS. 4a and 4b finally show the linearity over more than 2 decades for light in the 550 nm and 1150 nm wavelengths.
Figure 3B:
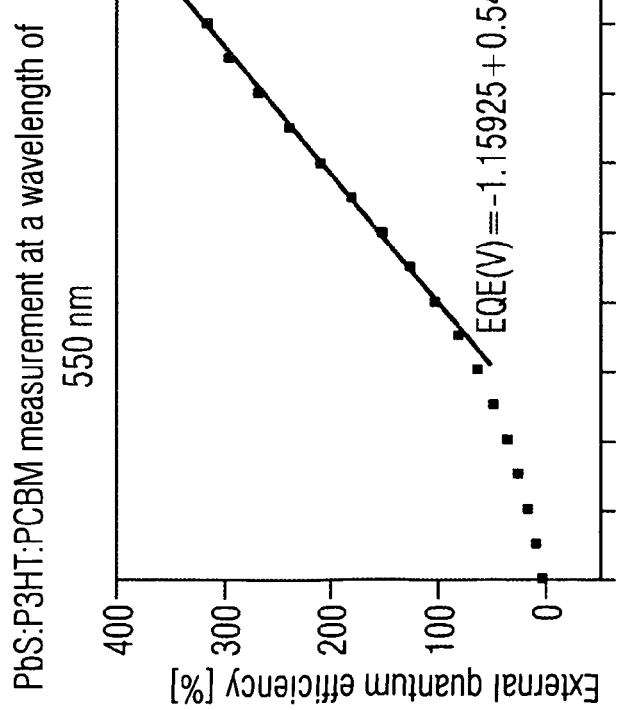

FIGS. 3a and 3b show the external quantum efficiency depending on the reverse voltage applied (photoconductive effect). By increasing the voltage, the extraction can be improved up to a certain range and the intensification can be exploited by photoconductivity. As may be seen, this effect is linear within a certain voltage range.

Figure 4A:
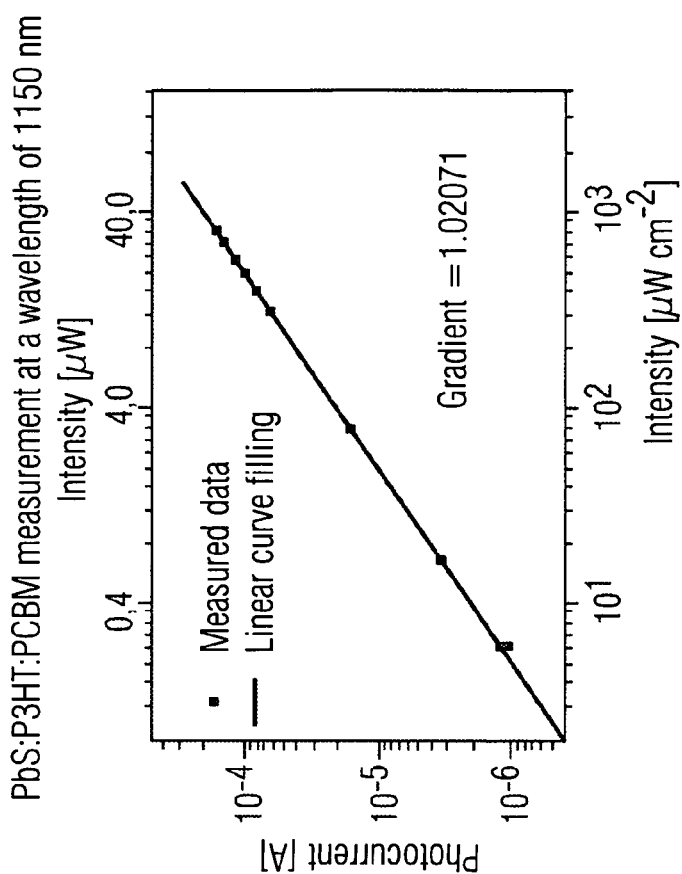
Figure 4B:
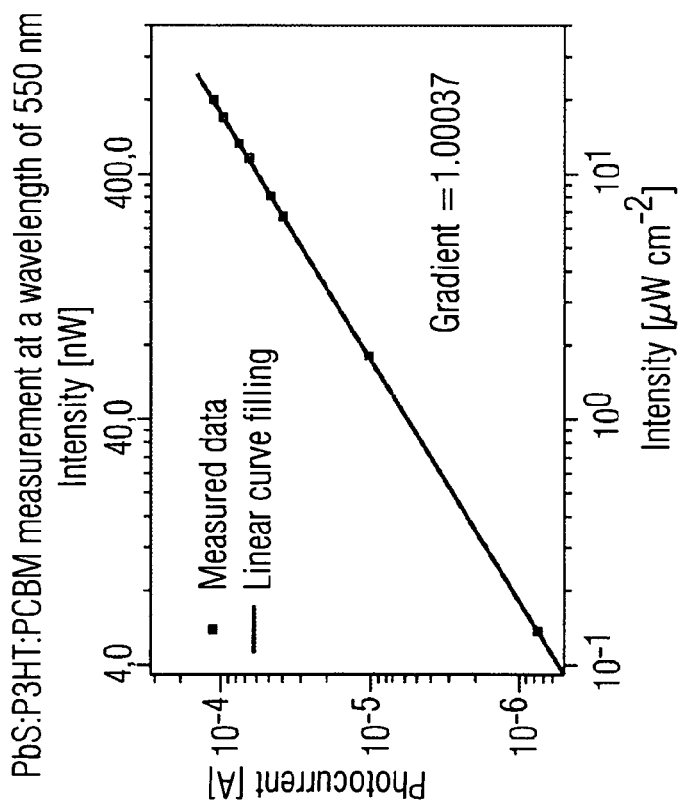

FIGS. 4a and 4b show linearity measurements in the two wavelengths of 550 nm and 1150 nm. As may be seen, the photodetectors modified with PbS nanocrystals exhibit a linear signal behavior compared to the radiated light intensity over more than 2 orders of magnitude.

The proposed methods and device firstly enables photodetectors to be produced cost-effectively and on a large scale especially for the imager region. By contrast with previously known photodetectors such as the bolometer, II-VI semiconductors and quantum well detectors, the new photodetectors, which contain semiconducting nanoparticles for displacement of the detection area, are not technically complex or expensive to produce and may be mounted on flexible substrates by simple printing processes.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. An infrared photo detector to detect infrared radiation on an organic basis, comprising:
   a first electrode;
   a second electrode; and
   an organically based photo active layer arranged between the first and second electrodes, the organically based photo active layer containing semi-conducting infrared-absorbing nanoparticles, the infrared-absorbing nanoparticles containing lead sulfide (PbS) and being at least partially in the form of nanocrystals, whereby the organically based photo active layer is constructed as a three component bulk hetero junction of lead sulfide: poly(3-hexylthiophene-2,5-diyl):phenyl-$C_{61}$-butyric acid methyl ester (PbS:P3HT:PCBM), such that separation of charge carriers takes place at interfaces of the three components, the hetero junction having the infrared-absorbing nanoparticles for infrared radiation, the hetero junction having a hole transport component and an electron conducting component, wherein
   the infrared-absorbing nanoparticles have a diameter selected to match the infrared radiation to be absorbed.

2. The photo detector according to claim 1, wherein the hole transport component contains poly(3-hexylthiophen-2,5-diyl) (P3HT).

3. The photo detector according to claim 2, wherein the electron conducting component contains phenyl-$C_{61}$-butyric acid methyl ester (PCBM).

4. The photo detector according to claim 3, wherein the photo detector detects radiation in a spectral range above 1100 nm.

5. The photo detector according to claim 4, wherein the infrared-absorbing nanoparticles are dissolved in the organically based photoactive layer.

6. The photo detector according to claim 5, wherein at least some of the infrared-absorbing nanoparticles are in a colloidal state in the organically based photoactive layer.

7. The photo detector according to claim 6, wherein the photo detector has a hole transporter in addition to the organically based photoactive layer.

8. The photo detector according to claim 1, wherein the electron conducting component contains phenyl-$C_{61}$-butyric acid methyl ester (PCBM).

9. The photo detector according to claim 1, wherein the photo detector detects radiation in a spectral range above 1100 nm.

10. The photo detector according to claim 1, wherein the infrared-absorbing nanoparticles are dissolved in the organically based photoactive layer.

11. The photo detector according to claim 1, wherein at least some of the infrared-absorbing nanoparticles are in a colloidal state in the organically based photoactive layer.

12. The photo detector according to claim 1, wherein the photo detector has a hole transporter in addition to the organically based photoactive layer.

13. A method for producing an infrared photo detector to detect infrared radiation on an organic basis, comprising:
    providing a first electrode;
    providing a second electrode; and
    forming an organically based photo active layer from a solution of poly(3-hexylthiophene-2,5-diyl) (P3HT) and phenyl-$C_{61}$-butyric acid methyl ester (PCBM) containing lead sulfide (PBS) nanoparticles, the organically based photo active layer being formed between the first and second electrodes, whereby the organically based photo active layer is constructed as a three component bulk hetero junction of lead sulfide:poly(3-hexylthiophene-2,5-diyl):phenyl-$C_{61}$-butyric acid methyl ester (PbS:P3HT:PCBM), such that separation of charge carriers takes place at interfaces of the three components, the hetero junction having a hole transport component and an electron conducting component, wherein
    the nanoparticles are at least partially in the form of nanocrystals and have a diameter selected to match the infrared radiation to be absorbed.

14. A method comprising:
    providing an organically-based photo detector comprising:
        a first electrode;
        a second electrode; and
        an organically based photo active layer arranged between the first and second electrodes, the organically based photo active layer containing semi-conducting infrared-absorbing nanoparticles, the infrared-absorbing nanoparticles containing lead sulfide (PbS) and being at least partially in the form of nanocrystals, whereby the organically based photo active layer is constructed as a three component bulk hetero junction of lead sulfide:poly(3-hexylthiophene-2,5-diyl):phenyl-$C_{61}$-butyric acid methyl ester (PbS:P3HT:PCBM), such that separation of charge carriers takes place at interfaces of the three components, the hetero junction having the infrared-absorbing nanoparticles for infrared radiation, the hetero junction having a hole transport component and an electron conducting component, wherein the infrared; and
    using the photo detector to detect infrared radiation.

* * * * *